United States Patent
Wijaya et al.

(10) Patent No.: US 11,916,524 B1
(45) Date of Patent: Feb. 27, 2024

(54) AUTO-CALIBRATION OF POWER LINE COMMUNICATION SIGNAL LEVELING

(71) Applicant: Bendix Commercial Vehicle Systems LLC, Avon, OH (US)

(72) Inventors: Tandi Wijaya, Highland Heights, OH (US); Michael D. Cremona, Lakewood, OH (US); Thomas J. Hayes, Lakewood, OH (US); Ran Wei, North Ridgeville, OH (US)

(73) Assignee: Bendix Commercial Vehicle Systems LLC, Avon, OH (US)

(*) Notice: Subject to any disclaimer, the term of this patent is extended or adjusted under 35 U.S.C. 154(b) by 18 days.

(21) Appl. No.: 17/948,632

(22) Filed: Sep. 20, 2022

(51) Int. Cl.
| | |
|---|---|
| *H02G 3/30* | (2006.01) |
| *H03G 3/30* | (2006.01) |
| *H03F 3/04* | (2006.01) |
| *H04B 3/54* | (2006.01) |
| *B60R 16/023* | (2006.01) |

(52) U.S. Cl.
CPC ............ *H03G 3/30* (2013.01); *B60R 16/023* (2013.01); *H03F 3/04* (2013.01); *H04B 3/54* (2013.01); *H03G 2201/103* (2013.01)

(58) Field of Classification Search
CPC .. H03G 3/30; H03G 2201/103; B60R 16/023; H03F 3/04; H04B 3/54
See application file for complete search history.

(56) References Cited

U.S. PATENT DOCUMENTS

| | | | |
|---|---|---|---|
| 6,694,235 | B2 | 2/2004 | Akiyama |
| 8,374,573 | B1 | 2/2013 | Potter, Sr. |
| 9,742,601 | B2 | 8/2017 | Streit |
| 10,050,674 | B1 | 8/2018 | Hayes et al. |
| 2010/0117734 | A1 | 5/2010 | Hurwitz et al. |
| 2014/0109182 | A1 | 4/2014 | Smith et al. |

*Primary Examiner* — Robert L Deberadinis
(74) *Attorney, Agent, or Firm* — Reising Ethington P.C.

(57) ABSTRACT

A system for calibrating signals received over a power line within a vehicle includes a signal conditioning circuit that converts the analog input signals into digital input signals. In one embodiment the circuit includes an adjustable gain circuit that outputs an amplifier gain signal establishing an amplifier gain level and an amplifier that outputs amplified signals responsive to the analog input signals and the amplifier gain signal. In another embodiment, the circuit includes a bias circuit that outputs a bias signal establishing a bias level and a comparator that generates the digital input signals responsive to the analog input signals and the bias signal. A controller receives the digital input signals and generates, depending on the embodiment, one or more control signals configured to control the configuration of the amplifier gain signal and amplifier gain level and/or the bias signal and the bias level.

20 Claims, 6 Drawing Sheets

AUTO-CALIBRATION OF POWER LINE COMMUNICATION SIGNAL LEVELING

BACKGROUND OF THE INVENTION a. Field of the Invention

This invention relates to communications systems used in vehicles such as tractor-trailers. In particular, the invention relates to a system and method for calibrating signals received over a power line within a vehicle.

b. Background Art

Power line communication (PLC) is a communication method in which data is transmitted over wires that are also used to deliver electric power. The data is encoded within a signal that is transmitted over the wires in frequency ranges outside of those used to transmit electric power. PLC is advantageous relative to other communication methods because it enables communication using existing wiring. Tractor-trailers frequently employ PLC to exchange messages between members of the tractor-trailer including, for example, sensor readings from vehicle systems including anti-lock braking systems, collision avoidance systems, tire pressure monitoring systems and other vehicle systems as well as commands used to control anti-lock braking systems, lighting systems and other vehicle systems.

In a vehicle employing PLC, a plurality of electronic control units or controllers may transmit signals to, and/or receive signals from, other controllers on the vehicle along the power line. Further, in vehicles such as tractor-trailers having multiple members, each member of the vehicle (including the tractors, each trailer and any dollies) may include one or more controllers that transmit signals to, and/or receive signals from, other controllers along the power line. The distance between any two controllers on the vehicle will vary and may vary significantly in, for example, a tractor-trailer having multiple trailers. Because signals tend to attenuate over longer distances along the power line, the amplitude of signals received by a controller from other controllers on the vehicle may vary with variation in distance between the controllers. Conventional signal conditioning circuits used to receive signals transmitted along the power line and condition those signals for delivery to a controller are not configured to handle signals having different amplitudes. Rather, conventional signal conditioning circuits amplify each received signal in the same manner and cannot be adjusted to account for changes in amplitude. As a result, conventional systems may not detect signals transmitted over longer distances and having relatively small amplitudes. Conventional signal conditioning circuits are also configured to apply the same level and type of bias (e.g., linear biasing or auto-biasing) when handling received signals. As a result, conventional systems fail to optimize bias by allowing variation of the level or type of bias.

The inventors herein have recognized a need for a system and method for calibrating signals received over a power line within a vehicle that will minimize and/or eliminate one or more of the above-identified deficiencies.

BRIEF SUMMARY OF THE INVENTION

This invention relates to communications systems used in vehicles such as tractor-trailers. In particular, the invention relates to a system and method for calibrating signals received over a power line within a vehicle.

One embodiment of a system for calibrating signals received over a power line within a vehicle includes a signal conditioning circuit configured to convert analog input signals received over the power line in the vehicle into digital input signals. The signal conditioning circuit includes an adjustable gain circuit configured to output an amplifier gain signal establishing an amplifier gain level and an amplifier configured to output amplified signals responsive to the analog input signals and the amplifier gain signal. The digital input signals are formed in response to the amplified signals. The system further includes a controller configured to receive the digital input signals and to generate control signals configured to control the configuration of the amplifier gain signal output by the adjustable gain circuit and the amplifier gain level.

Another embodiment of a system for calibrating signals received over a power line within a vehicle includes a signal conditioning circuit configured to convert analog input signals received over the power line in the vehicle into digital input signals. The signal conditioning circuit includes a bias circuit configured to output a bias signal establishing a bias level and a comparator configured to generate the digital input signals responsive to the analog input signals and the bias signal. The system further includes a controller configured to receive the digital input signals and generate one or more control signals configured to control the configuration of the bias signal output by the bias circuit and the bias level.

Another embodiment of a system for calibrating signals received over a power line within a vehicle includes a signal conditioning circuit configured to convert analog input signals received over the power line in the vehicle into digital input signals. The signal conditioning circuit includes an adjustable gain circuit configured to output an amplifier gain signal establishing an amplifier gain level and an amplifier configured to output amplified signals responsive to the analog input signals and the amplifier gain signal. The signal conditioning circuit further includes a bias circuit configured to output a bias signal establishing a bias level and a comparator configured to generate the digital input signals responsive to the amplified signals and the bias signal. The system further includes a controller configured to receive the digital input signals and generate one or more amplifier gain control signals configured to control the configuration of the amplifier gain signal output by the adjustable gain circuit and the amplifier gain level. The controller is further configured to generate one or more bias control signals configured to control the configuration of the bias signal output by the bias circuit and the bias level.

A system and method for calibrating signals received over a power line within a vehicle in accordance the present teachings represent an improvement as compared to conventional systems and methods. In particular, embodiments of the system and method disclosed herein enable adjustment of the amplifier gain in the signal conditioning circuit thereby ensuring that the associated controller will receive signals generated by other controllers located at varying distances from the controller in the vehicle. Embodiments of the system and method disclosed herein may alternatively, or in addition, enable adjustment of the level and type of bias applied to received signals thereby enabling the system to optimize signal biasing.

The foregoing and other aspects, features, details, utilities, and advantages of the present invention will be apparent from reading the following description and claims, and from reviewing the accompanying drawings.

DETAILED DESCRIPTION OF THE INVENTION

Figure 1:
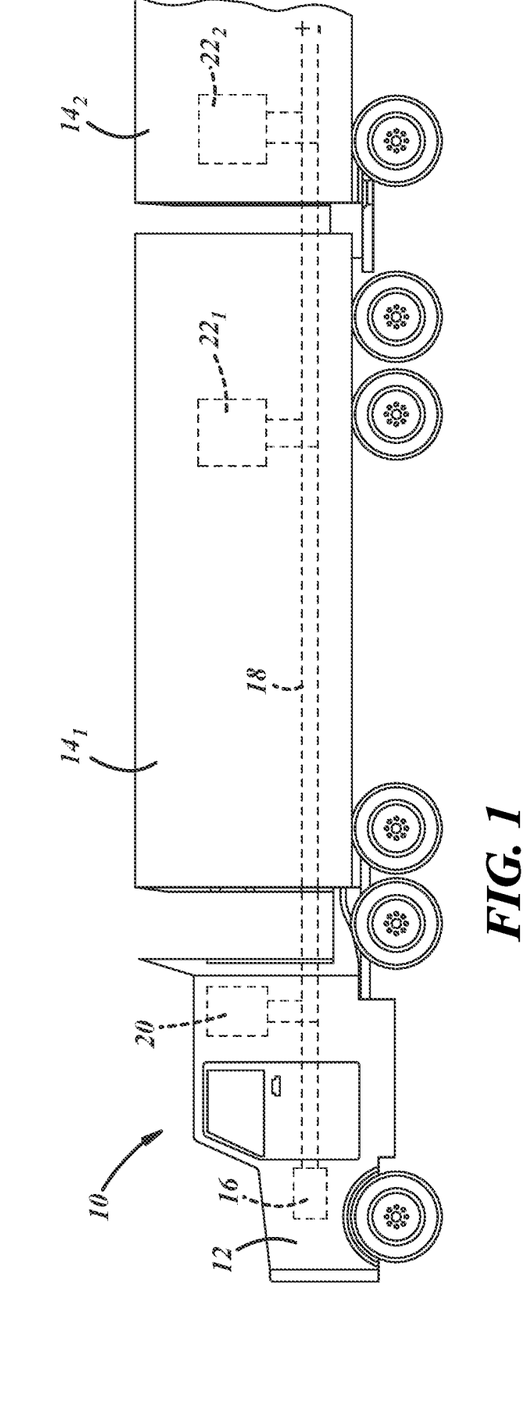
FIG. 1 is a diagrammatic view of a vehicle including a plurality of electronic systems communicating along a power line in the vehicle.

Referring now to the drawings wherein like reference numerals are used to identify identical components in the various views, FIG. 1 illustrates a vehicle and, in particular, a tractor-trailer 10. Tractor-trailer 10 (also referred to as a semi) contains a truck or tractor 12 and one or more trailers $14_1 \ldots 14_N$. Tractor 12 contains a power unit, such as an internal combustion engine, and steering and drive axles. Tractor 12 also contains a battery 16 for use in starting the power unit and in providing power to various accessory systems. Trailers $14_1 \ldots 14_N$ are provided to store freight and are detachably coupled to tractor 12. Although a pair of trailers 14 are shown in the illustrated embodiment, it should be understood that the number of trailers 14 attached to tractor 12 may vary.

Tractor 12 and trailers 14 may include various fluid and power lines that extend between tractor 12 and trailers 14 including power line 18. The fluid and power lines allow delivery of fluids and electrical power from tractor 12 to trailers 14 for use in, for example, tire pressure management, braking, and activation of tail lights on trailer 14. Power line 18 also forms part of a network used to transmit communications between various electronic systems 20, $22_1 \ldots 22_N$ on tractor 12 and trailers 14, respectively. Systems 20, 22 may comprise any of a wide variety of systems commonly employed on tractor-trailer 10 including, for example, anti-lock braking systems, collision avoidance systems, tire pressure monitoring and control systems, trailer load monitoring systems, and lighting systems. Power line 18 may enable transmission of data from one or more systems 22 on trailers 14 to a system 20 on tractor 12 including, for example, sensor readings indicative of the operation of an anti-lock braking system, the location of surrounding vehicles and infrastructure, pressure within the tires on a trailer 14, or a shift in the load carried by a trailer 14. Power line 18 may also enable transmission of commands and data from tractor 12 to trailers 14 for use in controlling elements of an anti-lock braking system, tire pressure control system or lighting system on one or more of trailers 14.

Figure 2:
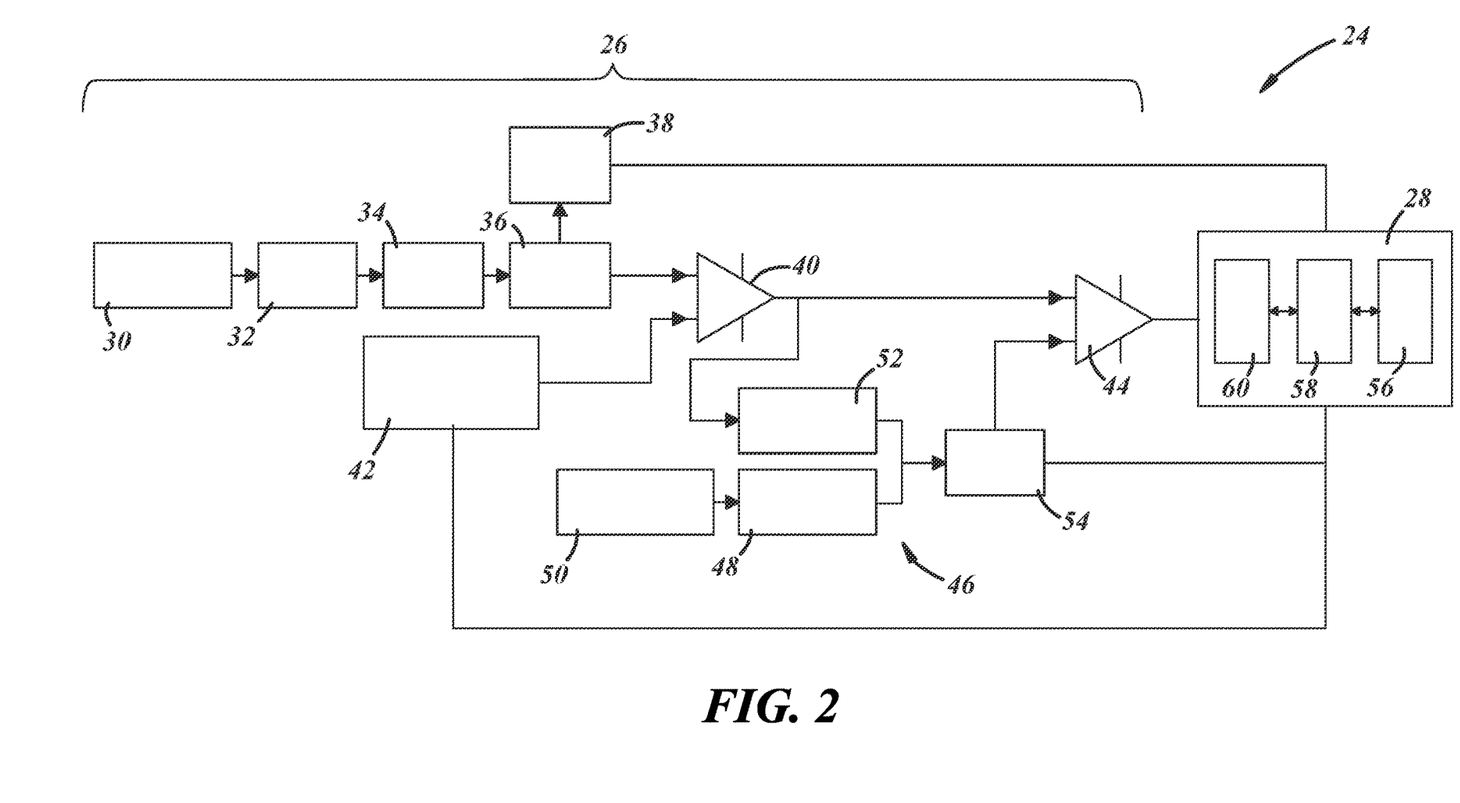
FIG. 2 is a diagrammatic and schematic view of a system for calibrating signals received over a power line within a vehicle in accordance with one embodiment of the present teachings.

Referring now to FIG. 2, each system 20, 22 may include a system 24 for calibrating signals received over power line 18. System 24 may include a signal conditioning circuit 26 and a controller 28.

Signal conditioning circuit 26 is provided to condition signals received from power line 18 for use by controller 28 and, in particular, to convert analog input signals received over power line 18 into digital input signals for controller 28. Signals may be transmitted along power line 18 at a frequency between 100-400 KHz using amplitude shift keying (ASK) or frequency shift keying (FSK) in accordance with a communications protocol developed by the Society of Automotive Engineers (SAE) set forth in a document number J2497 and titled "Power Line Carrier Communications for Commercial Vehicles." Circuit 26 may include a signal acquisition circuit 30, an AC (alternating current) leveling circuit 32, a filter 34, a pre-amplifier 36, a peak detector circuit 38, an amplifier 40, an adjustable gain circuit 42, a comparator 44, and a bias circuit 46.

Signal acquisition circuit 30 couples signal conditioning circuit 26 to power line 18. Circuit 30 may include a capacitor that couples circuit 26 to power line 18 and a clamping diode downstream of the capacitor such as a Zener diode. It should be understood that circuit 30 may take various forms and may implement inductive coupling of circuit 26 to power line 18 rather than capacitive coupling.

AC leveling circuit 32 is provided to remove the direct current (DC) component of the signal received from signal acquisition circuit 30 and center the alternating current (AC) component at about zero (0) Volts. Circuit 32 may include a capacitor.

Filter 34 is provided to prevent passage of analog input signals outside of certain frequencies. Filter 34 may be configured to prevent passage of signals that are not intended for controller 28 and/or cannot be interpreted by controller 28 and may prevent passage of signals subject to significant interference. Filter 34 may comprise a bandpass filter.

Pre-amplifier 36 is provided to strengthen the analog input signal prior to delivery to amplifier 40. Pre-amplifier 36 is conventional in the art and receives signals output by bandpass filter 34 and transmits signals to an input terminal of amplifier 40.

Peak detector circuit 38 identifies and measures amplitude peaks in the analog input signals. Circuit 38 is conventional in the art. Circuit 38 generates signals indicative of the amplitude corresponding to each analog input signal responsive to signals generated by pre-amplifier 36. Peak detector circuit 38 provides those signals to controller 28 for a purpose discussed hereinbelow.

Amplifier 40 is configured to output amplified signals that correspond to the analog input signals, but have an increased amplitude. Amplifier 40 is conventional in the art. In accordance with one aspect of the disclosed embodiments, the gain applied by amplifier 40 to the analog input signal varies depending on amplifier gain signal received from adjustable gain circuit 42. Amplifier 40 generates amplified signals responsive to the analog input signals (and, in particular, the signals received from pre-amplifier 36) and the amplifier gain signal. The digital input signals provided to controller 28 are then derived from the amplified signals.

Adjustable gain circuit 42 is provided to vary the gain of amplifier 40. Circuit 42 may comprise a digital potentiometer. Circuit 42 outputs an amplifier gain signal establishing an amplifier gain level for amplifier 40. The configuration of the amplifier gain signal and, therefore, the amplifier gain level will vary responsive to an amplifier gain control signal received from controller 28.

Comparator 44 is configured to generate the digital input signals provided to controller 28 responsive to the analog input signals received over power line 18 and, in particular, the amplified signals based on the analog input signals generated by amplifier 40. Comparator 44 compares the amplified signals from amplifier 40 against a bias signal generated by bias circuit 46 that establishes a DC (direct current) bias level. Comparator 44 is conventional in the art.

Bias circuit 46 is provided to generate a bias signal establishing a bias level for use in biasing circuit elements within comparator 44. In accordance with another aspect of the teachings disclosed herein, circuit 46 may be configured to vary the level and/or type of bias. Bias circuit 46 may include a linear bias circuit 48, an adjustable linear leveling circuit 50, an auto bias circuit 52 and a bias selection circuit 54.

Linear bias circuit 48 generates a linear bias signal having a preset bias level that is independent of the analog input signal and the amplified signal generated by amplifier 40. Circuit 48 may comprise a voltage divider controlled by one or more digital potentiometers. Circuit 48 outputs the linear bias signal responsive to a linear leveling signal output by adjustable linear leveling circuit 50.

Adjustable linear leveling circuit 50 generates a linear leveling signal configured to control linear bias circuit 48 and the configuration of the linear bias signal and bias level. Circuit 50 may comprise a digital potentiometer connected to a reference voltage source (not shown). Circuit 50 generates the linear leveling signal responsive to control signal from controller 28.

Auto bias circuit 52 generates an auto bias signal having a bias level that is dependent on analog input signal and, in particular, the amplified signal from amplifier 40. Circuit 52 is conventional in the art. Circuit 52 receives the signal generated by amplifier 40 and configures the auto-bias signal in response to shift the bias level downward by a predetermined amount thereby permitting a comparison within comparator 44 between the amplified signal and a signal similar to the amplified signal but at a lower DC level.

Bias selection circuit 54 is configured to output one of the linear bias signal and the auto bias signal and deliver that signal to comparator 44 as the bias signal. Circuit 54 may comprise one or more switches. Circuit 54 selects one of the linear bias signal and the auto bias signal responsive to a control signal from controller 28.

Controller 28 is provided to decode messages received from power line 18 and to encode messages for transmission on power line 18. Controller 28 may further be provided to perform a variety of actions in response to received messages depending on the purpose of the system 20, 22 in which controller 28 is employed. Controller 28 may comprise a programmable microprocessor or microcontroller or may comprise an application specific integrated circuit (ASIC). Controller 28 may include a memory 56 and a central processing unit (CPU) 58. Controller 28 may also include an input/output (I/O) interface 60 including a plurality of input/output pins or terminals through which controller 28 may receive a plurality of input signals and transmit a plurality of output signals. The input signals may include signals received from signal conditioning circuit 26 while the output signals may include signals transmitted to power line 18 through, for example a corresponding signal conditioning circuit that converts the digital output signals from controller 28 to analog output signals. In the illustrated embodiment, a single controller 28 is shown. It should be understood, however, that the functionality of controller 28 described herein may be divided among multiple sub-controllers. In accordance with the present teachings, controller 28 may be configured with appropriate programming instructions (i.e., software or a computer program) to implement several steps in a method for calibrating signals received over power line 18 described below.

Figure 3A:
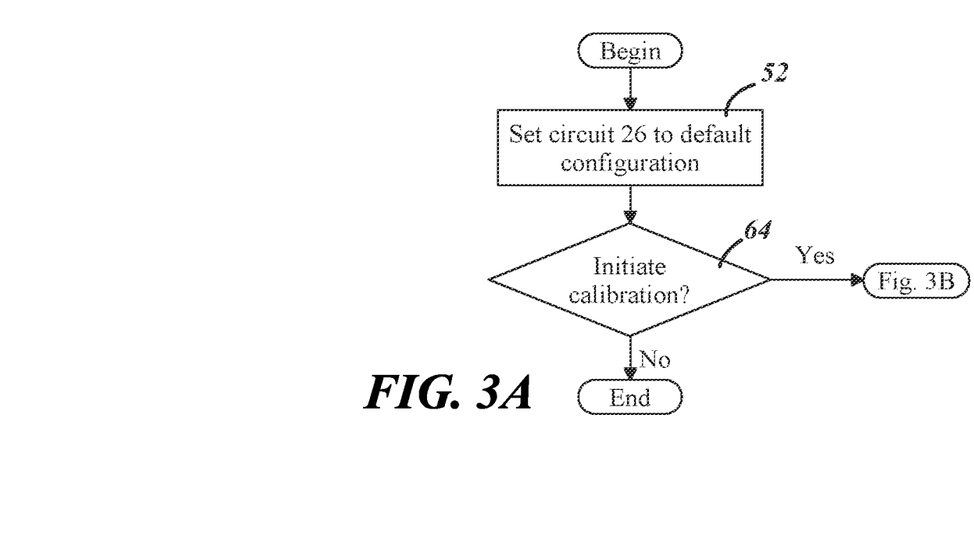
FIGS. 3A-3E are flow chart diagrams illustrating steps in a method for calibrating signals received over a power line within a vehicle in accordance with one embodiment of the present teachings.

Referring now to FIG. 3A, one embodiment of a method for calibrating signals received over power line 18 may begin with the step 62 of setting the configuration of signal conditioning circuit 26 to a default configuration. In performing step 62, controller 28 may generate control signals to one or more of adjustable gain circuit 42, adjustable linear leveling circuit 50 and bias selection circuit 54. In one embodiment, controller 28 generates one control signal for adjustable gain circuit 42 that controls the configuration of the amplifier gain signal output by circuit 42 and the amplifier gain level to establish the amplifier gain level in amplifier 40 at a default level. Controller 28 further generates a second control signal for adjustable linear leveling circuit 50 to control the configuration of the linear bias signal output by linear bias circuit 48 and establish the linear bias level at a default level. Finally, controller 28 generates a third control signal for bias selection circuit 54 that causes circuit 54 to select the linear bias signal output by linear bias circuit 48 as the bias signal input to comparator 44. It should be understood that the default configuration for signal conditioning circuit 26 may vary.

The method may continue with the step 64 of determining whether to initiate the process to calibrate signal conditioning circuit 26. Calibration of circuit 26 is most useful when there has been a change to a vehicle such as tractor-trailer 10. For example, if a trailer 14 is added to tractor-trailer 10, communications over longer distances may be required between some systems 20, 22 on the vehicle. The increasing distance may lead to attenuation of signals along power line 18 and a reduction in amplitude for some signals. In this situation, it may be desirable to increase the gain of amplifier 40 in the signal conditioning circuit 24 of one or more systems 20, 22. Conversely, if a trailer 14 is removed from tractor-trailer 10, the furthest distance that signals are required to travel between any two systems 20, 22 on tractor-trailer 10 may be reduced. In this situation, it may be desirable to decrease the gain of amplifier 40 in the signal conditioning circuit 24 of one or more systems 20, 22. Therefore, in performing step 64, controller 28 may be configured to initiate the calibration process in response to conditions that may be indicative of a change to the vehicle. In the case of a tractor-trailer 10, the tractor-trailer is likely to move from an active state (in which battery 16 is providing electrical energy to the power unit in tractor 12 (e.g., an internal combustion engine or electric motor) to allow the power unit to begin to generate mechanical energy required to rotate the wheels of vehicle 10) to an inactive state (in which battery 16 is not providing electrical energy to the power unit) prior to coupling or uncoupling a trailer 14 from the tractor 12. Therefore, controller 28 may, for example, be configured to initiate the calibration process whenever the vehicle subsequently moves from an inactive state to an active state. Controller 28 may receive a signal indicative of whether tractor-trailer 10 is in active state or an inactive state from a variety of different sources. For example, sensors may provide signals to controller 28 indicative of the position or state of a start or ignition switch in tractor-trailer 10 or the delivery of voltage or current from the battery 18 to the power unit. The vehicle's engine or motor control system may also provide signals to controller 28 indicative of the state of the power unit (e.g., if the engine is operating at 0 rpm, the vehicle is inactive). Other systems, such as an anti-lock braking system, may stop transmitting certain signals when the vehicle is an inactive state and the absence of such signals may therefore be indicative of an inactive state. In addition to initiating the calibration process when the vehicle moves from an inactive state to an active state, controller 28 may initiate the calibration process under a variety of other conditions. Controller 28 may, for example, initiate the calibration process after a predetermined interval of time has passed since a prior instance of the calibration process or after a predetermined interval of time has passed during a period in which tractor-trailer 10 is in an active state. Controller 28 may also initiate the calibration process in response to a condition input by an operator or owner of the vehicle through I/O interface 60. If controller 28 determines that calibration of signal conditioning circuit 26 is not required, the method ends.

Figure 3B:
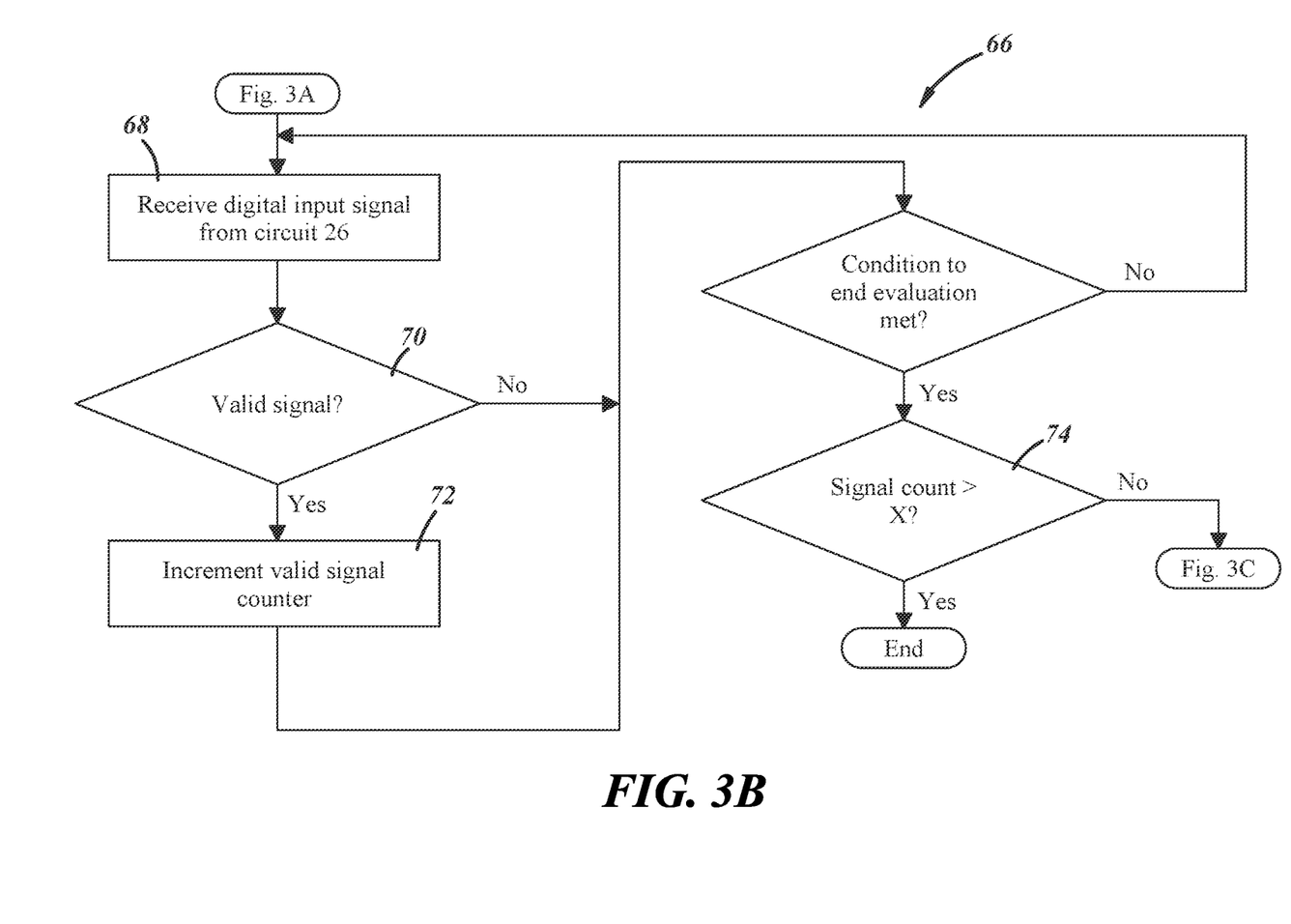

Referring to FIG. 3B, if controller 28 determines that calibration of circuit 26 should be initiated, the method may continue with the step 66 of determining whether the current configuration of circuit 26 (e.g., the default configuration set in step 62) is sufficient and, in particular, whether to adjust the amplifier gain level. Step 66 may include several substeps 68, 70, 72. In substep 68, controller 28 may receive a digital input signal generated by comparator 44 of circuit 26 in response to analog input signals received from power line 18. In substep 70, controller 28 may determine whether the digital input signal is a valid digital input signal. In one embodiment, a digital input signal is a valid digital input signal if the digital input signal has a frequency within a certain frequency range. It should be understood, however, that various conditions could be established to determine whether a digital input signal is a valid digital input signal. If the digital input signal is a valid input signal, controller 28 may increment a valid signal counter in substep 72 and store the value in memory 56. Substeps 68, 70, 72 may be repeated until a predetermined condition is met. The condition may, for example, be that controller 28 has received a predetermined number of signals or that a period of time has passed. Once the condition is met, controller 28 may perform substep 74 in which the controller 28 compares the number of valid digital input signals (as indicated by the counter stored in memory 56) to a threshold number to determine whether number of valid digital input signals meets a predetermined condition (e.g., is greater than) the threshold number. If controller 28 determines that the number of valid digital input signals meets the predetermined condition relative to the threshold number, the method may end.

Figure 3C:
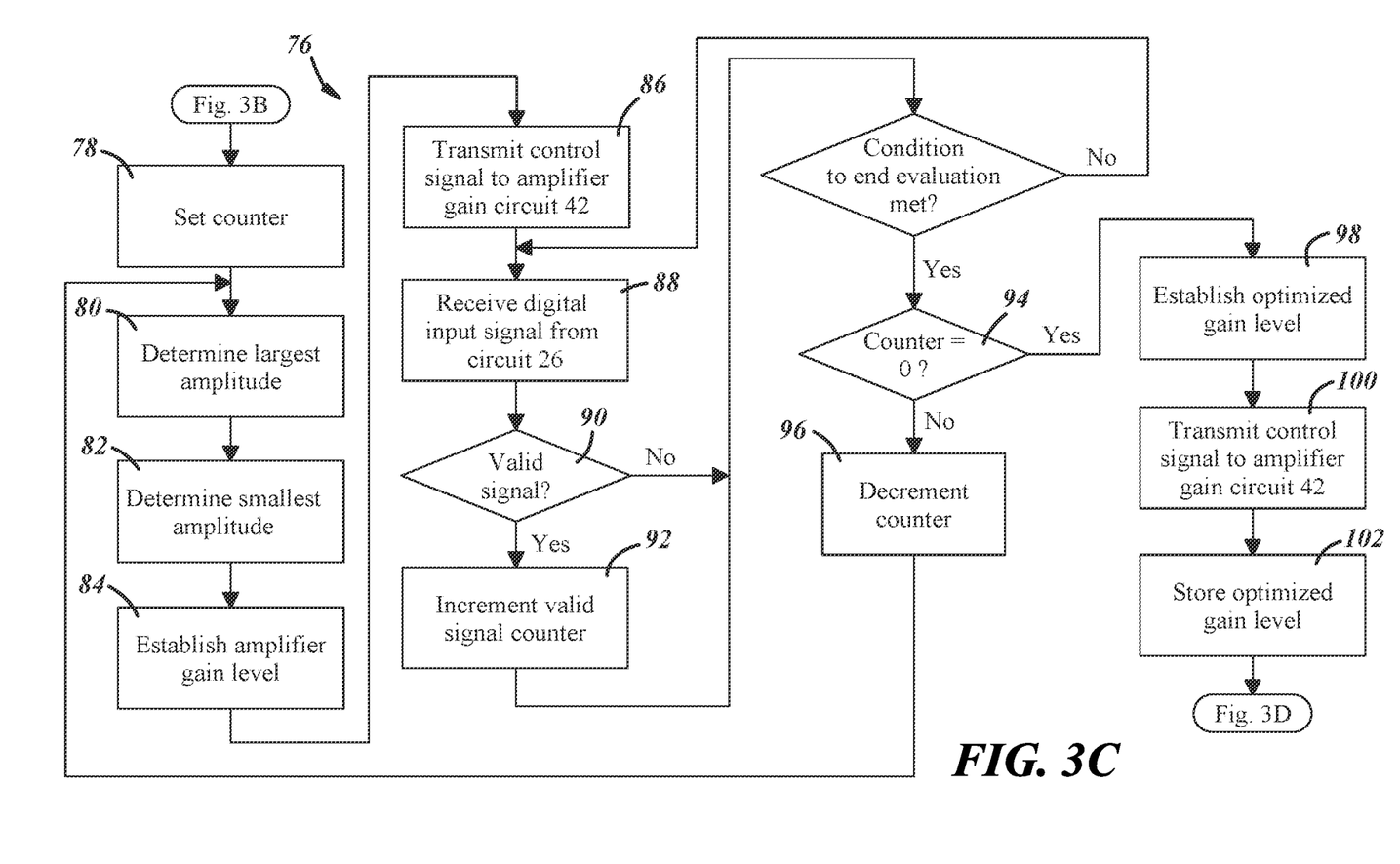

Referring now to FIG. 3C, if controller 28 determines that the number of valid digital input signals does not meet the predetermined condition relative to the threshold number, the method may continue with the step 76 of optimizing the amplifier gain level of amplifier 40. Step 76 may include a number substeps 78, 80, 82, 84, 86, 88, 90, 92, 94, 96. In order to optimize the amplifier gain level, controller 28 may be configured to set the amplifier gain level to a plurality of different levels and test the impact of each gain level on the conversion of the analog input signal to the digital input signals received by controller 28. Therefore, in substep 78, controller 28 may set a counter to a predetermined number corresponding to the number of different amplifier gain levels (and different configurations for circuit 26) that will be tested by controller 28.

In substeps 80 and 82, controller 28 determines the largest amplitude and the smallest amplitude, respectively, obtained by the plurality of analog input signals corresponding to the plurality of digital input signals obtained during the repeated performance of substep 68 of step 66. Controller 28 may receive signals from peak detector circuit 38 indicative of the amplitude of each analog input signal that is ultimately converted to a digital input signal by circuit 26 and received by controller 28. Controller 28 may store values indicative of the amplitude of each analog input signal in memory 56 and determine the largest and smallest amplitude from among all of the stored values. Alternatively, controller 28 may store a single largest amplitude value and single smallest amplitude value in memory 56 and overwrite these values as needed responsive to ongoing comparisons of the stored values against the value indicated by each signal received from peak detector circuit 38 as that signal is received.

In substep 84, controller 28 establishes the amplifier gain level responsive to the largest amplitude and smallest amplitude identified in substeps 80, 82. Controller 28 may, for example, determine the difference between the largest and smallest amplitudes or an average of the largest and smallest amplitudes. Using this difference or average, controller 28 may access a data structure such as a look up table in a memory such as memory 56 that correlates the amplitude difference or average with a predetermined amplifier gain level. In substep 86, controller 28 then generates a control signal and transmits that control signal to adjustable gain circuit 42 causing circuit 42 output an amplifier gain signal to amplifier 40 that establishes the predetermined amplifier gain level in amplifier 40.

Once the new amplifier gain level is established, controller 28 performs a series of substeps 88, 90, 92, similar to substeps 68, 70, 72, in step 66 discussed hereinabove. In particular, in substep 88, controller 28 may receive a digital input signal generated by comparator 44 of circuit 26 in response to analog input signals received from power line 18. In substep 90, controller 28 may determine whether the digital input signal is a valid digital input signal. In one embodiment, a digital input signal is a valid digital input signal if the digital input signal has a frequency within a certain frequency range. It should be understood, however, that various conditions could be established to determine whether a digital input signal is a valid digital input signal. If the digital input signal is a valid input signal, controller 28 may, in substep 92, increment a valid signal counter and store the number in memory 56. Substeps 88, 90, 92 may again be repeated until a predetermined condition is met. The condition may, for example, be that controller 28 has received a predetermined number of signals or that a period of time has passed. Once the condition is met, controller 28 may perform substep 94 in which controller 28 determines whether the value of the counter established in substep 78 meets a predetermined condition relative to a predetermined number (e.g., whether the value of the counter equals zero). If controller 28 determines in substep 94 that the value of the counter does not meet the predetermined condition relative to the predetermined number, controller 28 may adjust the value of the counter (e.g., decrement the counter) in substep 96, return to substep 80 and repeats substeps 80, 82, 84, 86, 88, 90, 92, 94 such that controller 28 determines the largest amplitude and the smallest amplitude, respectively, obtained by the plurality of analog input signals corresponding to the plurality of digital input signals obtained during the repeated performance of substep 88 in the original iteration of step 76, establishes the amplifier gain level responsive to the largest amplitude and smallest amplitude, receives a another plurality of digital input signals in response to another plurality of analog input signals received from power line 18, determines determine whether each of these digital input signals is a valid digital input signal and, if so, increments a valid signal counter and stores the number in memory 56, and, once the predetermined condition is met relating to signal capture, again determines whether the value of the counter established in substep 78 meets the predetermined condition relative to the predetermined number (e.g., whether the value of the counter equals zero).

Once controller 28 determines in substep 94 that the value of the counter doe meet the predetermined condition relative to the predetermined number, controller 28 may proceed to substep 98 in which controller 28 establishes the optimized amplifier gain level responsive to the numbers obtained during the repeated instances of substep 92. Controller 28 may, for example, identify the largest number among the plurality of numbers obtained during the repeated instances of substep 92 at each amplifier gain level to determine which amplifier gain level provided the largest number of valid digital input signals. Controller 28 may then generate a control signal in substep 100 and transmit that control signal to adjustable gain circuit 42 causing circuit 42 to output an amplifier gain signal to amplifier 40 that establishes the optimized amplifier gain level in amplifier 40. Controller 28 may also store the optimized gain level in memory 56 in substep 102 for use in establishing the default configuration of circuit 24 in step 52 during subsequent iterations of the method.

Figure 3D:
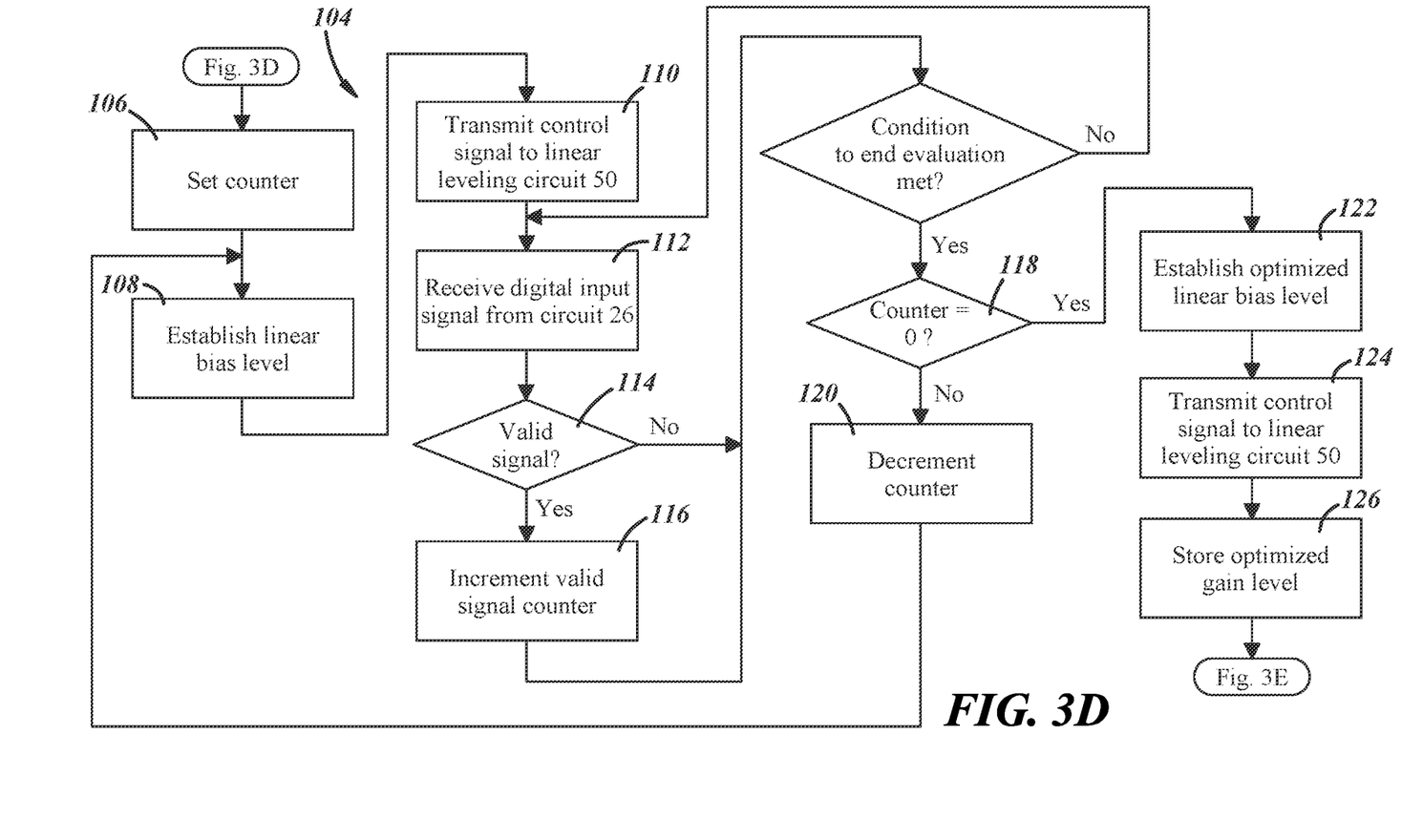

Referring now to FIG. 3D, following the step 76 of optimizing the amplifier gain level of amplifier 40, controller 28 may, in certain embodiments, perform the additional step 104 of optimizing the bias level in comparator 44 of circuit 26. Step 104 may again include a plurality of substeps 106, 108, 110, 112, 114, 116, 118, 122, 124, 126. In order to optimize the bias level, controller 28 may be configured to first set the linear bias level generated by linear bias circuit 48 of bias circuit 46 to a plurality of different levels and test the impact of each linear bias level on the conversion of the analog input signal to the digital input signals received by controller 28. Therefore, in substep 106, controller 28 may set a counter to a predetermined number corresponding to the number of different linear bias levels (and different configurations for circuit 26) that will be tested by controller 28. Subsequently, in substeps 108 and 110, controller 28 may establish a linear bias level in linear bias circuit 48 and then generate a control signal and transmit that signal to adjustable linear leveling circuit 50 which in turn generates a linear leveling signal controlling the configuration of the linear bias signal output by linear bias circuit 48 and the linear bias level. Initially, controller 28 may cause linear bias circuit 48 to generate a linear bias signal establishing a linear bias level corresponding to the linear bias level established in the default configuration of signal conditioning circuit in step 52.

After setting the initial linear bias level, controller 28 may, in substep 112, again receive a digital input signal generated by comparator 44 of circuit 26 in response to analog input signals received from power line 18. In substep 114, controller 28 may determine whether the digital input signal is a valid digital input signal. In one embodiment, a digital input signal is a valid digital input signal if the digital input signal has a frequency within a certain frequency range. It should be understood, however, that various conditions could be established to determine whether a digital input signal is a valid digital input signal. If the digital input signal is a valid input signal, controller 28 may increment a valid signal counter in substep 116 and store the number in memory 56. Substeps 112, 114, 116 may be repeated until a predetermined condition is met. The condition may, for example, be that controller 28 has received a predetermined number of signals or that a period of time has passed. Once the condition is met, controller 28 may proceed to substep 118 in which controller 28 determines whether the value of the counter established in substep 106 meets a predetermined condition relative to a predetermined number (e.g., whether the value of the counter equals zero). If controller 28 determines in substep 118 that the value of the counter does not meet the predetermined condition relative to the predetermined number, controller 28 may adjust the value of the counter (e.g., decrement the counter) in substep 120.

Controller 28 then returns to substep 108 and repeats substeps 108, 110, 112, 114, 116, 118, such that controller 28 establishes a new linear bias level in substep 108, transmits a control signal to adjustable linear leveling circuit 50 in substep 110 to cause circuit 48 to generate a linear bias signal at the new linear bias level, receives a another plurality of digital input signals in response to another plurality of analog input signals received from power line 18 in substep 112, determines whether each of these digital input signals is a valid digital input signal in substep 114 and, if so, increments a valid signal counter in substep 116 and stores the value in memory 56, and, once the predetermined condition is met relating to signal capture, again determines in substep 118 whether the value of the counter meets the predetermined condition relative to the predetermined number (e.g., whether the value of the counter equals zero). In performing each instance of sub step 108, controller 28 may be configured to adjust the linear bias level in a predetermined manner. For example, controller 28 may increment or decrement the linear bias level by a predetermined amount each time (resulting in a linear or non-linear change in the linear bias level).

Once controller 28 determines in substep 118 that the value of the counter doe meet the predetermined condition relative to the predetermined number, controller 28 may proceed to step 122 in which controller 28 establishes an optimized linear bias responsive to the numbers obtained during the repeated instances of substep 116. Controller 28 may, for example, identify the largest number among the plurality of numbers obtained in substep 116 at each linear bias level to determine which linear bias level provided the largest number of valid digital input signals. In substep 124, controller 28 may then generate a control signal and transmit that control signal to adjustable linear leveling circuit 50 causing linear bias circuit 48 output a linear bias signal that establishes the optimized linear bias in comparator 44. Controller 28 may also store the optimized linear bias level in memory 56 in substep 126 for use in establishing the default configuration of circuit 26 in step 52 during subsequent iterations of the method.

Figure 3E:
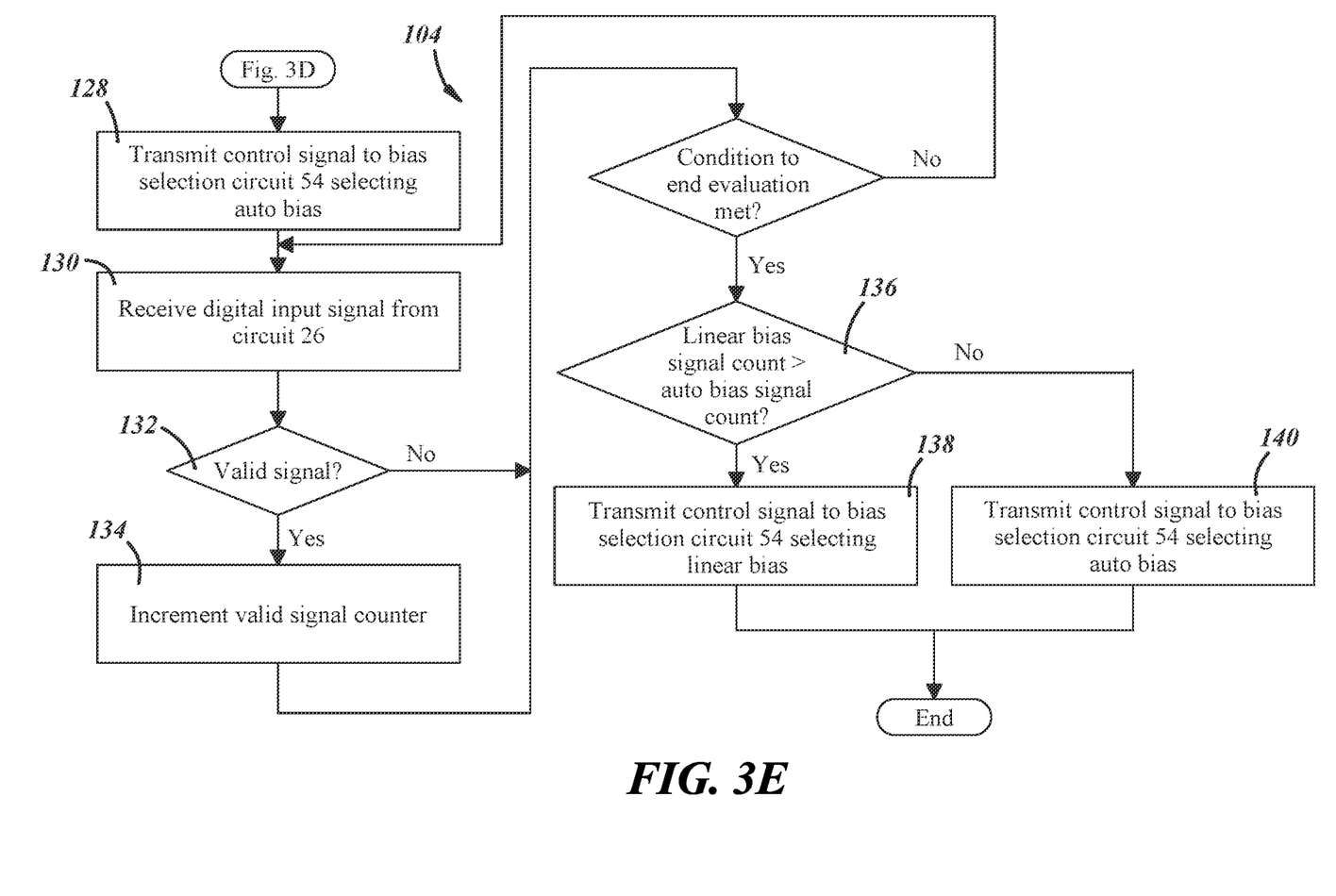

Referring now to FIG. 3E, in some embodiments, the step 104 of optimizing the bias level may include selecting one of a linear bias signal generated by linear bias circuit 48 and an auto bias signal generated by auto bias circuit 52 as the bias signal. In these embodiments, step 104 may further include the substeps 128, 130, 132, 134. In substep 128, controller 28 may generate a bias control signal and transmit the signal to bias selection circuit 54 to select the auto bias signal from auto bias circuit 52 as the bias signal provided to comparator 44. In substep 130, controller 28 may again receive a digital input signal generated by comparator 44 of circuit 26 in response to analog input signals received from power line 18. In substep 132, controller 28 may determine whether the digital input signal is a valid digital input signal. In one embodiment, a digital input signal is a valid digital input signal if the digital input signal has a frequency within a certain frequency range. It should be understood, however, that various conditions could be established to determine whether a digital input signal is a valid digital input signal. If the digital input signal is a valid input signal, controller 28 may increment a valid signal counter in substep 134 and store the value in memory 56. Substeps 130, 132, 134 may be repeated until a predetermined condition is met. The condition may, for example, be that controller 28 has received a predetermined number of signals or that a period of time has passed.

Once the condition is met, controller 28 may proceed to substep 136 in which controller 28 compares the number obtained in substep 126 and associated with the optimized linear bias level to the number obtained in substep 134 and associated with the auto bias level. If controller 28 determines that the number associated with the optimized linear bias level is greater than the number associated with the auto bias level, controller 28 generates a control signal in step 138 configured to cause bias selection circuit 54 to select the linear bias signal output by linear bias circuit 48 and direct the linear bias signal to comparator 44. Alternatively, if controller 28 determines that the number associated with the auto bias level is greater than the number associated with the optimized linear bias level, controller 28 generates a control signal in step 140 configured to cause bias selection circuit 54 to select the auto bias signal output by auto bias circuit 52 and direct the auto bias signal to comparator 44.

A system 24 and method for calibrating signals received over a power line 18 within a vehicle in accordance the present teachings represent an improvement as compared to conventional systems and methods. In particular, embodiments of the system 24 and method disclosed herein enable adjustment of the amplifier gain in the signal conditioning circuit 26 thereby ensuring that the associated controller 28 will receive signals generated by other controllers located at varying distances from the controller 28 in the vehicle. Embodiments of the system 24 and method disclosed herein may alternatively, or in addition, enable adjustment of the level and type of bias applied to received signals thereby enabling the system to optimize signal biasing.

While the invention has been shown and described with reference to one or more particular embodiments thereof, it will be understood by those of skill in the art that various changes and modifications can be made without departing from the spirit and scope of the invention.

What is claimed is:

1. A system for calibrating signals received over a power line within a vehicle, comprising:
   a signal conditioning circuit configured to convert analog input signals received over the power line in the vehicle into digital input signals including
      an adjustable gain circuit configured to output an amplifier gain signal establishing an amplifier gain level; and,
      an amplifier configured to output amplified signals responsive to the analog input signals and the amplifier gain signal, the digital input signals formed in response to the amplified signals; and,
   a controller configured to
      receive the digital input signals; and,
      generate control signals configured to control the configuration of the amplifier gain signal output by the adjustable gain circuit and the amplifier gain level.

2. The system of claim 1 wherein the controller is further configured to determine whether to adjust the amplifier gain level.

3. The system of claim 2 wherein the controller is further configured, in determining whether to adjust the amplifier gain level, to:
   receive a plurality of the digital input signals;
   determine a number of valid digital input signals from among the plurality of digital input signals; and,
   compare the number to a threshold number.

4. The system of claim 1 wherein the controller is further configured to optimize the amplifier gain level.

5. The system of claim 4 wherein the controller is further configured, in optimizing the amplifier gain level, to:
   receive a first plurality of the digital input signals corresponding to a first plurality of the analog input signals;
   determine the largest amplitude obtained by the first plurality of the analog input signals;
   determine the smallest amplitude obtained by the first plurality of the analog input signals;
   establish the amplifier gain level at a first amplifier gain level responsive to the largest amplitude and the smallest amplitude.

6. The system of claim 5 wherein the controller is further configured, in optimizing the amplifier gain level, to:
   receive a second plurality of the digital input signals corresponding to a second plurality of the analog input signals after establishing the amplifier gain level at the first amplifier gain level;
   determine a first number of valid digital input signals from among the second plurality of the digital input signals; and,
   store the first number in a memory.

7. The system of claim 6 wherein the controller is further configured, in optimizing the amplifier gain level, to
   determine the largest amplitude obtained by the second plurality of the analog input signals;
   determine the smallest amplitude obtained by the second plurality of the analog input signals;
   establish the amplifier gain level at a second amplifier gain level responsive to the largest amplitude obtained by the second plurality of the analog input signals and the smallest amplitude obtained by the second plurality of the analog input signals;
   receive a third plurality of the digital input signals corresponding to a third plurality of the analog input signals after establishing the amplifier gain level at the second amplifier gain level;
   determine a second number of valid digital input signals from among the third plurality of digital input signals;
   store the second number in a memory; and,
   establish the amplifier gain level responsive to the first and second numbers.

8. A system for calibrating signals received over a power line within a vehicle, comprising:
   a signal conditioning circuit configured to convert analog input signals received over the power line in the vehicle into digital input signals including
      a bias circuit configured to output a bias signal establishing a bias level; and,
      a comparator configured to generate the digital input signals responsive to the analog input signals and the bias signal; and,
   a controller configured to
      receive the digital input signals; and,
      generate one or more control signals configured to control the configuration of the bias signal output by the bias circuit and the bias level.

9. The system of claim 8 wherein the bias circuit includes:
   an adjustable linear leveling circuit configured to output a linear leveling signal responsive to a first control signal of the one or more control signals from the controller; and,
   a linear bias circuit configured to output a linear bias signal responsive to the linear leveling signal.

10. The system of claim 9 wherein the bias circuit includes:
   an auto bias circuit configured to output an auto bias signal; and, a bias selection circuit configured to output one of the linear bias signal and the auto bias signal as the bias signal responsive to a second control signal of the one or more control signals from the controller.

11. The system of claim 8 wherein the controller is further configured to optimize the bias level.

12. The system of claim 11 wherein the controller is further configured, in optimizing the bias level, to:
receive a first plurality of the digital input signals from the comparator when the bias level is at a first bias level;
determine a first number of valid digital input signals from among the first plurality of digital input signals;
change the bias level from the first bias level to a second bias level different from the first bias level;
receive a second plurality of the digital input signals from the comparator when the bias level is at the second bias level;
determine a second number of valid digital input signals from among the second plurality of digital input signals; and,
determine an optimized bias level responsive to the first and second numbers.

13. The system of claim 11 where the controller is further configured, in optimizing the bias level, to select one of a linear bias signal generated by a linear bias circuit and an auto bias signal generated by an auto bias circuit as the bias signal.

14. The system of claim 13 wherein the controller is further configured, in selecting one of the linear bias signal and the auto bias signal, to:
receive a first plurality of the digital input signals from the comparator when the bias signal is the linear bias signal;
determine a first number of valid digital input signals from among the first plurality of digital input signals;
receive a second plurality of the digital input signals from the comparator when the bias signal is the auto bias signal;
determine a second number of valid digital input signals from among the second plurality of digital input signals; and,
compare the first number to the second number.

15. A system for calibrating signals received over a power line within a vehicle, comprising:
a signal conditioning circuit configured to convert analog input signals received over the power line in the vehicle into digital input signals including
an adjustable gain circuit configured to output an amplifier gain signal establishing an amplifier gain level; and,
an amplifier configured to output amplified signals responsive to the analog input signals and the amplifier gain signal;
a bias circuit configured to output a bias signal establishing a bias level; and,
a comparator configured to generate the digital input signals responsive to the amplified signals and the bias signal; and,
a controller configured to
receive the digital input signals; and,
generate one or more amplifier gain control signals configured to control the configuration of the amplifier gain signal output by the adjustable gain circuit and the amplifier gain level;
generate one or more bias control signals configured to control the configuration of the bias signal output by the bias circuit and the bias level.

16. The system of claim 15 wherein the controller is further configured to optimize the amplifier gain level, the controller further configured, in optimizing the amplifier gain level, to:
receive a first plurality of the digital input signals;
determine the largest amplitude obtained by the first plurality of digital input signals;
determine the smallest amplitude obtained by the first plurality of digital input signals;
establish the amplifier gain level responsive to the largest amplitude and the smallest amplitude.

17. The system of claim 15 wherein the bias circuit includes:
an adjustable linear leveling circuit configured to output a linear leveling signal responsive to a first control signal of the one or more bias control signals from the controller; and,
a linear bias circuit configured to output a linear bias signal responsive to the linear leveling signal.

18. The system of claim 17 wherein the bias circuit includes:
an auto bias circuit configured to output an auto bias signal; and,
a bias selection circuit configured to output one of the linear bias signal and the auto bias signal as the bias signal responsive to a second control signal of the one or more bias control signals from the controller.

19. The system of claim 15 where the controller is further configured to optimize the bias level and the controller is further configured, in optimizing the bias level, to select one of a linear bias signal generated by a linear bias circuit and an auto bias signal generated by an auto bias circuit as the bias signal.

20. The system of claim 19 wherein the controller is further configured, in selecting one of the linear bias signal and the auto bias signal, to:
receive a first plurality of the digital input signals from the comparator when the bias signal is the linear bias signal;
determine a first number of valid digital input signals from among the first plurality of digital input signals;
receive a second plurality of the digital input signals from the comparator when the bias signal is the auto bias signal;
determine a second number of valid digital input signals from among the second plurality of digital input signals; and,
compare the first number to the second number.

* * * * *